US009721053B2

(12) United States Patent
Cheng et al.

(10) Patent No.: US 9,721,053 B2
(45) Date of Patent: Aug. 1, 2017

(54) METHOD AND SYSTEM FOR PRINTED CIRCUIT BOARD LAYOUT

(71) Applicants: Inventec (Pudong) Technology Corporation, Shanghai (CN); INVENTEC CORPORATION, Taipei (TW)

(72) Inventors: Yung-Chien Cheng, Taipei (TW); Ming-Hui Lin, Taipei (TW); Yi-Hsin Hsieh, Taipei (TW); Yu-Jen Lin, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 20 days.

(21) Appl. No.: 15/079,034

(22) Filed: Mar. 23, 2016

(65) Prior Publication Data

US 2017/0154145 A1 Jun. 1, 2017

(30) Foreign Application Priority Data

Nov. 26, 2015 (CN) .......................... 2015 1 0843244

(51) Int. Cl.
*G06F 17/50* (2006.01)
*H05K 1/11* (2006.01)
(52) U.S. Cl.
CPC ......... *G06F 17/5068* (2013.01); *H05K 1/115* (2013.01)
(58) Field of Classification Search
CPC .................................................. G06F 17/5068

USPC ......................................................... 716/137
See application file for complete search history.

(56) References Cited

U.S. PATENT DOCUMENTS

| | | | |
|---|---|---|---|
| 5,550,714 A * | 8/1996 | Nishiyama | G06F 17/509 716/124 |
| 5,838,581 A | 11/1998 | Kuroda | |
| 7,107,564 B1 * | 9/2006 | Teig | G06F 17/5077 716/129 |
| 2008/0010625 A1 | 1/2008 | Bittner et al. | |
| 2008/0222593 A1 * | 9/2008 | Fujimori | G06F 17/5068 716/137 |

(Continued)

FOREIGN PATENT DOCUMENTS

| | | |
|---|---|---|
| CN | 1610485 A | 4/2005 |
| TW | 1858750 A | 11/2006 |
| TW | 201422078 A | 6/2014 |

*Primary Examiner* — Suresh Memula
(74) *Attorney, Agent, or Firm* — CKC & Partners Co., Ltd.

(57) ABSTRACT

A system for printed circuit board layout includes a processing unit and a memory unit. The memory unit stores physical node data and virtual node data. The processing unit is electrically coupled to the memory unit and configured to execute steps of a method for printed circuit board layout. In particular, the physical node data of a printed circuit board (PCB) is acquired. The physical node data include a plurality of data structure and coordinate points of the physical nodes. The virtual node data of the PCB is acquired. The virtual node data include a plurality of data structure of the virtual nodes. A corresponding relation of the physical nodes and the virtual nodes is determined according to the physical node data and the virtual node data. The virtual nodes are disposed at the physical node coordinate points according to the corresponding relation.

10 Claims, 5 Drawing Sheets

(56) References Cited

U.S. PATENT DOCUMENTS

2013/0339917 A1* 12/2013 Darringer ........... G06F 17/5081
716/120
2015/0213187 A1* 7/2015 Goyal ................ G01R 31/2834
716/136

* cited by examiner

METHOD AND SYSTEM FOR PRINTED CIRCUIT BOARD LAYOUT

RELATED APPLICATIONS

This application claims priority to Chinese Application Serial Number 201510843244.0, filed on Nov. 26, 2015, which is herein incorporated by reference.

BACKGROUND

Technical Field

The present invention relates to printed circuit board layout technology. More particularly, the present invention relates to a method and a system for virtual node layout of signals between a dynamic random-access memory (DRAM) and a central processing unit (CPU) on a printed circuit board.

Description of Related Art

In the design of signal lines on a printed circuit board (PCB), signal lines between components include many branch lines, and the length and symmetry of every branch line must meet certain requirements.

The present circuit layout software can merely calculate a pin-to-pin length between components. If a signal node exists between one component to another component, for example, a via or a T point (the design of a signal connection is like a "T"), then a layout engineer has to manually dispose virtual nodes provided by the software at the signal nodes for the circuit layout software to calculate lengths between the signal nodes and the component pins.

As the complexity of PCB design increases, disposing virtual nodes manually not only results in problems of poor quality resulting from human error, but efficiency is low. Thus, those skilled in the art have been endeavoring to devise a method for PCB layout that disposes virtual nodes automatically.

SUMMARY

An aspect of the present disclosure provides a method for printed circuit board layout, which includes a number of steps. Physical node data of a printed circuit board are acquired. The physical node data include a plurality of physical node data structures of a plurality of physical nodes on the printed circuit board and a plurality of physical node coordinate points. Virtual node data of the printed circuit board are acquired. The virtual node data include a plurality of virtual node data structures of a plurality of virtual nodes on the printed circuit board. A corresponding relation of the physical nodes and the virtual nodes is determined according to the physical node data and the virtual node data. The virtual nodes are disposed at the physical node coordinate points according to the corresponding relation.

In an embodiment of the present disclosure, pin-to-pin path information of a plurality of components on the printed circuit board is acquired. The physical node data structures are generated according to the pin-to-pin path information.

In an embodiment of the present disclosure, signal line path information on the printed circuit board is acquired. The virtual node data structures are generated according to the signal line path information.

In an embodiment of the present disclosure, the physical node data structures and the virtual node data structures are compared.

In an embodiment of the present disclosure, the physical nodes are a plurality of vias.

Another aspect of the present application provides a system for printed circuit board layout, which includes a memory unit and a processing unit. The memory unit is configured to store physical node data and virtual node data on a printed circuit board. The processing unit is electrically coupled to the memory unit and configured to execute steps as outlined below. Physical node data of a printed circuit board are acquired. The physical node data include a plurality of physical node data structures of a plurality of physical nodes on the printed circuit board and a plurality of physical node coordinate points. Virtual node data of the printed circuit board are acquired. The virtual node data include a plurality of virtual node data structures of a plurality of virtual nodes on the printed circuit board. A corresponding relation of the physical nodes and the virtual nodes is determined according to the physical node data and the virtual node data. The virtual nodes are disposed at the physical node coordinate points according to the corresponding relation.

Through the technology disclosed in the present disclosure, coordinate locations of the virtual nodes can correspond to the physical nodes of the printed circuit board automatically and accurately. As a result, the time required for designing the printed circuit board layout can be reduced, and the possibility of human error can also be reduced.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure. Moreover, the description of steps is not used to limit the execution sequence thereof. Any device with an equivalent effect through rearrangement is also covered by the present disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
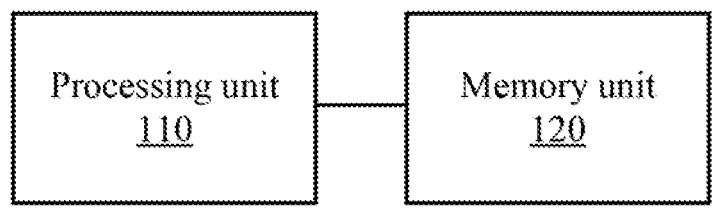
FIG. 1 is a schematic diagram of a system for printed circuit board (PCB) layout according to an embodiment of the present disclosure.

Reference is made first to FIG. 1. FIG. 1 is a schematic diagram of a system 100 for printed circuit board (PCB) layout according to an embodiment of the present disclosure. The system 100 includes a processing unit 110 and a memory unit 120. The memory unit 120 is configured to store physical node data and virtual node data of a printed circuit board.

The aforementioned physical nodes indicate positions connected by wires in different layers on the printed circuit board. For example, the physical nodes can be vias on the printed circuit board, and the vias are connected to wires in different layers to satisfy various component layout requirements on the printed circuit board. The physical node data include a plurality of physical node data structures of a plurality of physical nodes on the printed circuit board and a plurality of physical node coordinate points. For example, a relation that a component U1 is connected to a component U2 through physical nodes V1 and V2 sequentially can be represented as "U1←V1-V2→U2." However, the present disclosure is not limited to this example.

Moreover, users can use software to simulate signal control information between the components and then generate a control relation between the components. Based on design requirements, when the component U1 is connected to the component U2 and a component U3 by the same pin, branch points on the connecting path are the aforementioned virtual nodes. The virtual node data include a plurality of virtual node data structures of the virtual nodes on the printed circuit board. For example, a relation that the component U1 is connected to the component U2 through virtual nodes T1 and T2 can be represented as "U1←T1-T2→U2." However, the present disclosure is not limited to this example.

Figure 2:
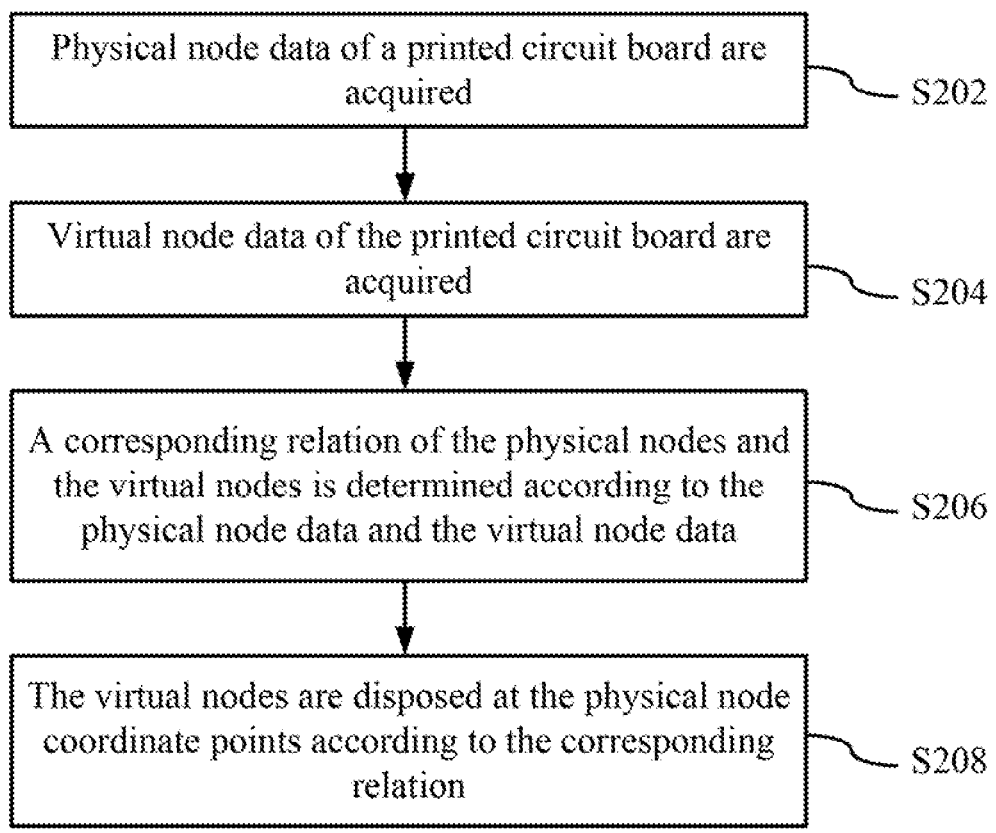
FIG. 2 is a flow chart of a method for printed circuit board (PCB) layout according to an embodiment of the present disclosure.

Reference will now be made to FIGS. 1 and 2. FIG. 2 is a flow chart of a method 200 for printed circuit board layout according to an embodiment of the present disclosure. The printed circuit board layout method 200 includes a plurality of steps S202-S208 and can be implemented by the printed circuit board layout system 100 as shown in FIG. 1. However, those skilled in the art should understand that, unless a particular sequence is specified, the sequence of the steps in the present embodiment can be adjusted according to actual needs. Moreover, all or some of the steps can even be executed simultaneously.

The processing unit 110 is electrically coupled to the memory unit 120, and configured to execute the steps outlined below. In step S202, physical node data of a printed circuit board are acquired.

Figure 3A:
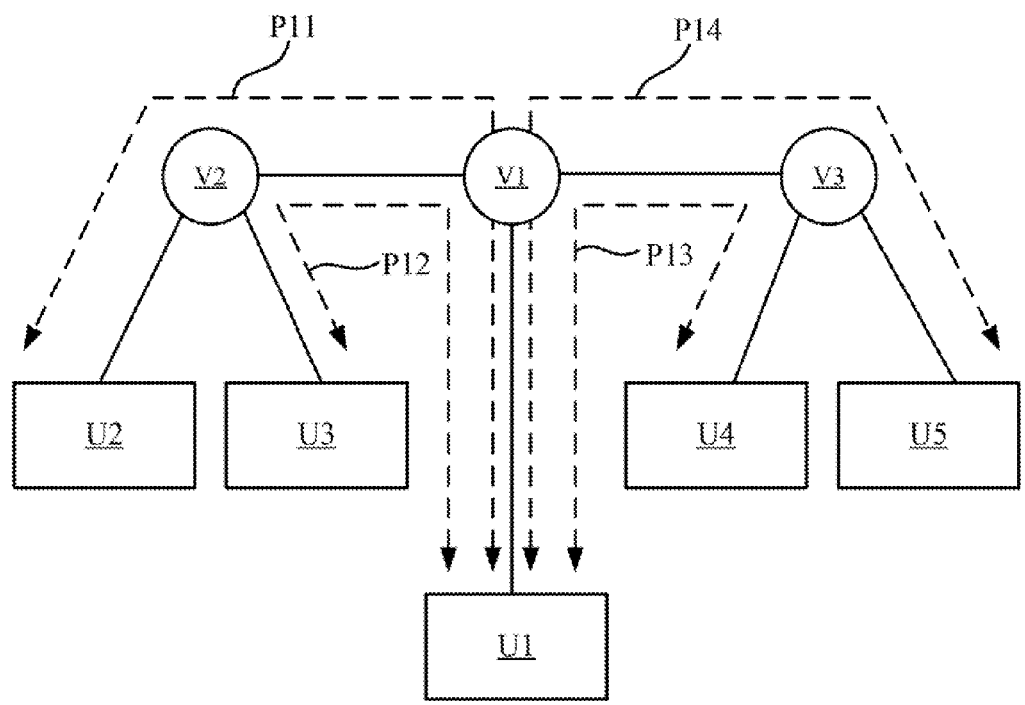
FIG. 3A is a schematic diagram of physical node data according to an embodiment of the present disclosure.

Reference is made to FIG. 3A to provide a description of an example. FIG. 3A is a schematic diagram of physical node data according to an embodiment of the present disclosure. As shown in FIG. 3A, paths of a component U1 electrically coupled to components U2-U5 are respectively represented as pin-to-pin paths P11-P14. The processing unit 110 can acquire pin-to-pin path information of all components on the printed circuit board. For example, pin-to-pin path P11 information of the component U1 and the component U2 is represented as "U1↔U2." Next, the processing unit 110 generates physical node data structures according to pin-to-pin path information P11-P14 of all components on the printed circuit board. Specifically, the processing unit 110 can decompose the pin-to-pin path P11 "U1↔U2" into a path from the component U1 to a physical node V1, the physical node V1 to a physical node V2, and the physical node V2 to the component U2, for example, represented as "U1↔V1+V1↔V2+V2↔U2." The processing unit 110 then generates a physical node data structure of the pin-to-pin path P11 according to "U1↔V1+V1↔V2+V2↔U2," for example, represented as "U1←V1-V2→U2." Therefore, the processing unit 110 can generate physical node data structures according to the pin-to-pin paths P11-P14 respectively, as shown in Table 1.

TABLE 1

Pin-to-pin paths and physical node data structures

| Pin-to-pin path | Physical node data structure |
|---|---|
| P11 (U1↔U2) | U1←V1-V2→U2 |
| P12 (U1↔U3) | U1←V1-V2→U3 |
| P13 (U1↔U4) | U1←V1-V3→U4 |
| P14 (U1↔U5) | U1←V1-V3→U5 |

In step S204, virtual node data of the printed circuit board are acquired.

Figure 3B:
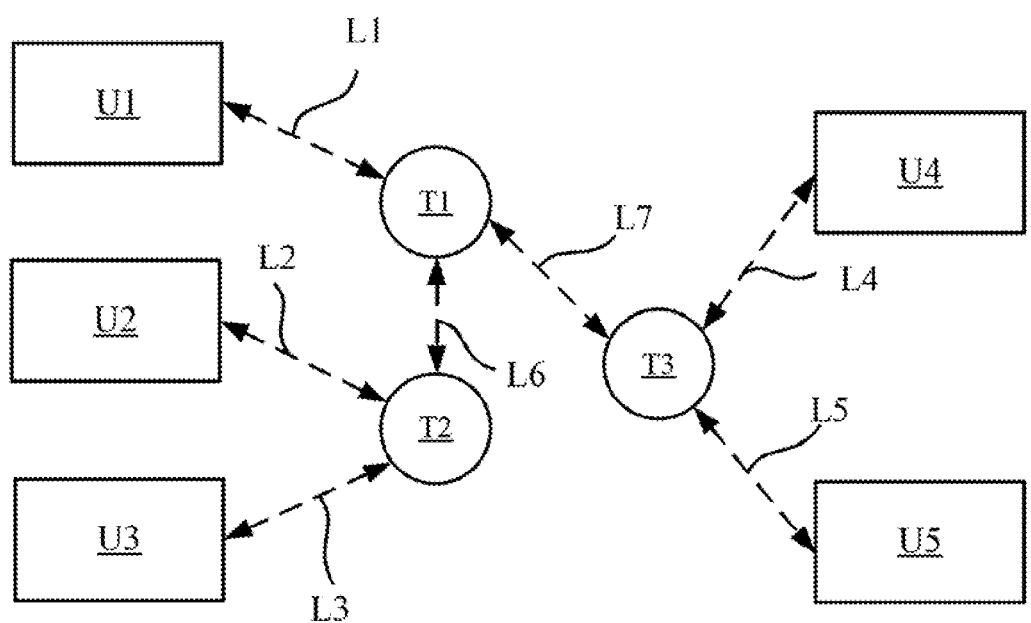
FIG. 3B is a schematic diagram of signal line paths according to an embodiment of the present disclosure.
Figure 3C:
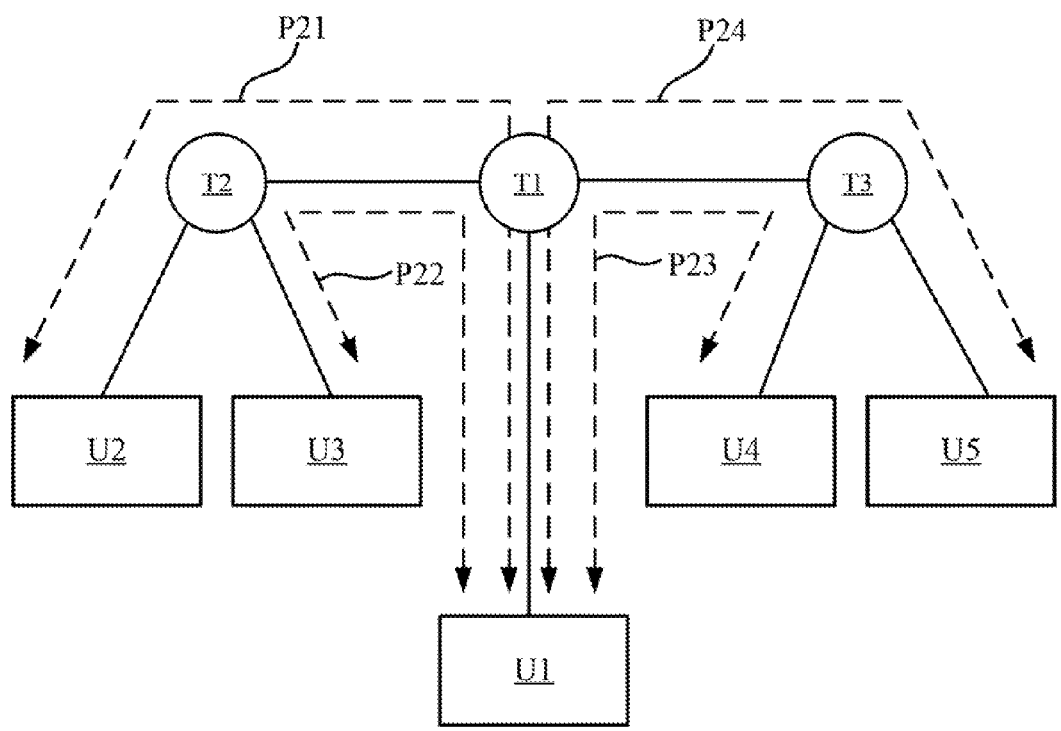
FIG. 3C is a schematic diagram of virtual node data according to an embodiment of the present disclosure.

Reference is made to FIGS. 3B and 3C to provide a description of an example. FIG. 3B is a schematic diagram of signal line paths according to an embodiment of the present disclosure. FIG. 3C is a schematic diagram of virtual node data according to an embodiment of the present disclosure. As shown in FIG. 3B, signal line paths of the component U1 and the components U2-U5 are represented as signal line paths L1-L7 from the component U1 to virtual nodes T1-T3. The processing unit 110 can acquire signal line path L1-L7 information of all components on the printed circuit board, for example, signal line path L1 information of the component U1 and the virtual node T1 is represented as "U1↔T1." Next, the processing unit 110 generates virtual node data structures according to signal line path information of all components on the printed circuit board. Specifically, the processing unit 110 can combine the signal line path L1 from the component U1 to the virtual node T1 (U1↔T1), the signal line path L6 from the virtual node T1 to the virtual node T2 (T1↔T2), and the signal line path L2 from the virtual node T2 to the component U2 (T2↔U2) to generate a virtual node data structure of a signal line path P21 that is between the component U1 and the component U2, for example, represented as "U1←T1-T2→U2." Therefore, the processing unit 110 can generate signal line paths P21-P24 and virtual node data structures that are between the components U1-U5 according to the signal line path L1-L7 information and the data structure of the components U1-U5 respectively, as shown in Table 2 and FIG. 3C.

TABLE 2

Signal line paths and virtual node data structures

| Signal line path | Virtual node data structure |
|---|---|
| P21 (L1 + L6 + L2) | U1←T1-T2→U2 |
| P22 (L1 + L6 + L3) | U1←T1-T2→U3 |
| P23 (L1 + L7 + L4) | U1←T1-T3→U4 |
| P24 (L1 + L7 + L5) | U1←T1-T3→U5 |

In step S206, a corresponding relation of the physical nodes and the virtual nodes is determined according to the physical node data and the virtual node data.

Specifically, the processing unit 110 compares the physical node data structures and the virtual node data structures. For example, the processing unit 110 sequentially compares the virtual node data structures in Table 2 according to the physical node data structure "U1←V1–V2→U2" of the pin-to-pin path P11, and determines that the virtual node data structure "U1←T1–T2→U2" corresponds to the physical node data structure "U1←V1–V2→U2." Similarly, the processing unit 110 sequentially compares the virtual node data structures in Table 2 according to the physical node data structure "U1←V1–V2→U3" of the pin-to-pin path P12, and determines that the virtual node data structure "U1←T1–T2→U3" corresponds to the physical node data structure "U1←V1–V2→U3." As mentioned above, the processing unit 110 sequentially compares the physical node data structures and the virtual node data structures to generate corresponding relations in Table 3. Therefore, the processing unit 110 can determine that the corresponding relation of the physical nodes and the virtual nodes is the virtual node T1 corresponding to the physical node V1, the virtual node T2 corresponding to the physical node V2, and the virtual node T3 corresponding to the physical node V3.

TABLE 3

Physical node data structures and virtual node data structures

| Physical node data structure | Virtual node data structure |
| --- | --- |
| U1←V1-V2→U2 | U1←T1-T2→U2 |
| U1←V1-V2→U3 | U1←T1-T2→U3 |
| U1←V1-V3→U4 | U1←T1-T3→U4 |
| U1←V1-V3→U5 | U1←T1-T3→U5 |

In step S208, the virtual nodes are disposed at the physical node coordinate points according to the corresponding relation. Specifically, the processing unit 110 disposes the virtual nodes T1-T3 at the corresponding physical node V1-V3 coordinate points according to the corresponding relation of the physical nodes V1-V3 and the virtual nodes T1-T3 and the physical node V1-V3 coordinate points stored in the memory unit 120.

As a result, without manual assistance, the processing unit 110 can dispose the virtual nodes T1-T3 at the corresponding physical node V1-V3 coordinate points automatically and accurately.

In practice, the processing unit 110 can be an independent microcontroller or a central processing unit (CPU). The memory unit 120 can be a hard disk, an optical disc, or a flash memory.

In conclusion, through the embodiments of the present disclosure, coordinate locations of the virtual nodes can correspond to the physical nodes of the printed circuit board automatically and accurately. As a result, the time required for designing the printed circuit board layout can be reduced, and the possibility of human error can also be reduced.

Even though the present disclosure is disclosed as above, the disclosure is not used to limit the present disclosure. It will be apparent to those skilled in the art that various modifications and variations can be made to the present disclosure without departing from the spirit or scope of the invention; thus, it is intended that the range protected by the present disclosure should refer to the scope of the following claims.

What is claimed is:

1. A method for printed circuit board layout, comprising the following steps:
   acquiring physical node data of a printed circuit board, wherein the physical node data comprise a plurality of physical node data structures of a plurality of physical nodes on the printed circuit board and a plurality of physical node coordinate points;
   acquiring virtual node data of the printed circuit board, wherein the virtual node data comprise a plurality of virtual node data structures of a plurality of virtual nodes on the printed circuit board;
   determining a corresponding relation of the physical nodes and the virtual nodes according to the physical node data and the virtual node data; and
   disposing the virtual nodes at the physical node coordinate points according to the corresponding relation.

2. The method of claim 1, wherein the step of acquiring the physical node data comprises:
   acquiring pin-to-pin path information of a plurality of components on the printed circuit board; and
   generating the physical node data structures according to the pin-to-pin path information.

3. The method of claim 1, wherein the step of acquiring the virtual node data comprises:
   acquiring signal line path information on the printed circuit board; and
   generating the virtual node data structures according to the signal line path information.

4. The method of claim 1, wherein the step of determining the corresponding relation of the physical nodes and the virtual nodes according to the physical node data and the virtual node data comprises:
   comparing the physical node data structures and the virtual node data structures.

5. The method of claim 1, wherein the physical nodes are a plurality of vias.

6. A system for printed circuit board layout, comprising:
   a memory unit, configured to store physical node data and virtual node data on a printed circuit board; and
   a processing unit, electrically coupled to the memory unit and configured to execute steps as follows:
      acquiring the physical node data of the printed circuit board, wherein the physical node data comprise a plurality of physical node data structures of a plurality of physical nodes on the printed circuit board and a plurality of physical node coordinate points;
      acquiring virtual node data of the printed circuit board, wherein the virtual node data comprise a plurality of virtual node data structures of a plurality of virtual nodes on the printed circuit board;
      determining a corresponding relation of the physical nodes and the virtual nodes according to the physical node data and the virtual node data; and
      disposing the virtual nodes at the physical node coordinate points according to the corresponding relation.

7. The system of claim 6, wherein the step of acquiring the physical node data comprises:
   acquiring pin-to-pin path information of a plurality of components on the printed circuit board; and
   generating the physical node data structures according to the pin-to-pin path information.

8. The system of claim 6, wherein the step of acquiring the virtual node data comprises:
   acquiring signal line path information on the printed circuit board; and generating the virtual node data structures according to the signal line path information.

9. The system of claim 6, wherein the step of determining the corresponding relation of the physical nodes and the virtual nodes according to the physical node data and the virtual node data comprises:

comparing the physical node data structures and the virtual node data structures.

10. The system of claim 6, wherein the physical nodes are a plurality of vias.

* * * * *